(12) United States Patent
Kyono et al.

(10) Patent No.: US 7,884,351 B2
(45) Date of Patent: Feb. 8, 2011

(54) NITRIDE SEMICONDUCTOR LIGHT-EMITTING DEVICE

(75) Inventors: Takashi Kyono, Itami (JP); Katsushi Akita, Itami (JP); Yusuke Yoshizumi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 678 days.

(21) Appl. No.: 11/874,908

(22) Filed: Oct. 19, 2007

(65) Prior Publication Data

US 2008/0035910 A1 Feb. 14, 2008

(51) Int. Cl.
*H01L 31/00* (2006.01)
(52) U.S. Cl. .............................. 257/15; 257/14; 257/79; 257/88; 257/94; 257/96; 257/97; 257/103
(58) Field of Classification Search ............. 257/14–25, 257/79–103
See application file for complete search history.

(56) References Cited

U.S. PATENT DOCUMENTS

| | | | |
|---|---|---|---|
| 5,684,309 A * | 11/1997 | McIntosh et al. | 257/191 |
| 6,608,330 B1 * | 8/2003 | Yamada | 257/90 |
| 6,995,389 B2 * | 2/2006 | Kim et al. | 257/13 |
| 7,084,421 B2 * | 8/2006 | Koike et al. | 257/14 |
| 7,095,052 B2 * | 8/2006 | Lester | 257/79 |
| 2006/0192218 A1 * | 8/2006 | Kyono et al. | 257/96 |
| 2010/0096650 A1 * | 4/2010 | Ubahara | 257/94 |

FOREIGN PATENT DOCUMENTS

| | | |
|---|---|---|
| JP | H10-022525 A | 1/1998 |
| JP | 2002-176198 A | 6/2002 |
| JP | 2005-217059 A | 8/2005 |

OTHER PUBLICATIONS

M. Yamada et al., "InGaN-Based Near-Ultraviolet and Blue-Light-Emitting Diodes with High External Quantum Efficiency Using a Patterned Sapphire Substrate and a Mesh Electrode," Japanese Journal of Applied Physics, Dec. 15, 2002, pp. L1431-L1433, vol. 41, The Japan Society of Applied Physics, Tokyo.

* cited by examiner

*Primary Examiner*—Zandra Smith
*Assistant Examiner*—Eric Ward
(74) *Attorney, Agent, or Firm*—James W. Judge

(57) ABSTRACT

In a nitride semiconductor light-emitting device (11), an emission region (17) has a quantum well structure (19), and lies between an n-type gallium nitride semiconductor region (13) and a p-type gallium nitride semiconductor region (15). The quantum well structure (19) includes a plurality of first well layers (21) composed of $In_xGa_{1-x}N$, one or a plurality of second well layers (23) composed of $In_yGa_{1-y}N$, and barrier layers (25). The first and second well layers (21) and (23) are arranged in alternation with the barrier layers (25). The second well layers (23) lie between the first well layers (21) and the p-type gallium nitride semiconductor region (15). The indium component y of the second well layers (23) is smaller than indium component x of the first well layers (21), and the thickness $D_{W2}$ of the second well layers (23) is greater than the thickness $D_{W1}$ of the first well layers (21).

6 Claims, 4 Drawing Sheets

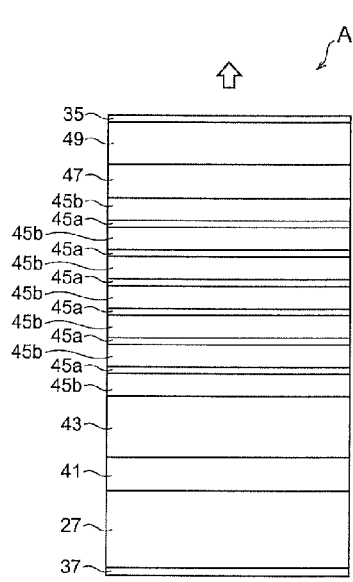
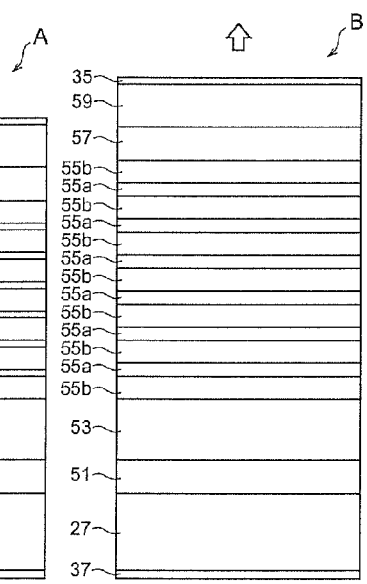
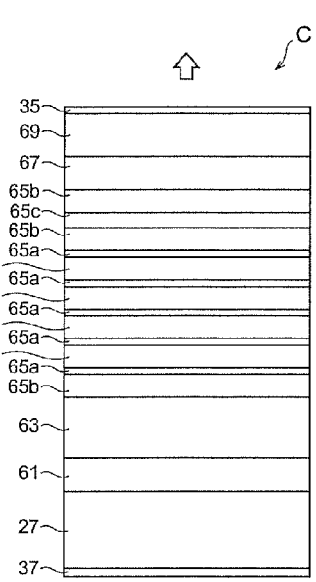
FIG. 3A  FIG. 3B  FIG. 3C
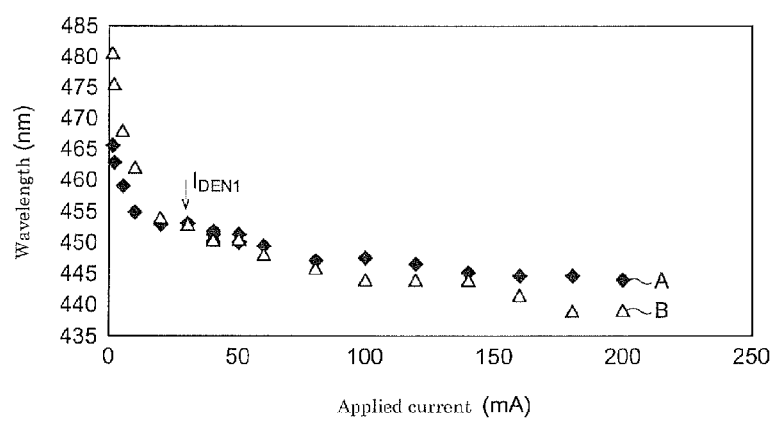
FIG. 4

NITRIDE SEMICONDUCTOR LIGHT-EMITTING DEVICE

BACKGROUND OF THE INVENTION

1. Technical Field

The present invention relates to nitride semiconductor light-emitting devices.

2. Description of the Related Art

Japanese Unexamined Pat. App. Pub. No. H10-22525 describes nitride light-emitting devices that emit light of any chromaticity (color saturation, color phase) per unit pixel, and particularly that emit pure white light. One example of a nitride light-emitting device in Japanese Unexamined Patent App. Pub. No. H10-22525 is furnished with a first multiple quantum well composed of a (trilaminar) 5-nm thick $In_{0.68}Ga_{0.32}N$ well layer, and a (quadrilaminar) 5-nm thick $In_{0.1}Ga_{0.9}N$ barrier layer, and with a second multiple quantum well composed of a (trilaminar) 5-nm thick $In_{0.3}Ga_{0.7}N$ well layer, and of 5-nm thick $In_{0.05}Ga_{0.95}N$ barrier layers. The first multiple quantum well emits yellow-green light with a peak wavelength of 570 nm, and the second multiple quantum well emits blue light with a peak wavelength of 450 nm. The second multiple quantum well lies between the first multiple quantum well and a transparent electrode. The wavelength components of light from the first multiple quantum well are complementary colors for the wavelength components of light from the second multiple quantum well.

A different example of a nitride light-emitting device in Japanese Unexamined Pat. App. Pub. No. H10-22525 has a first multiple quantum well that comprises $In_{0.5}Ga_{0.5}N$ well layers and exhibits a peak wavelength of 510 nm, a second multiple quantum well that comprises $In_{0.46}Ga_{0.54}N$ well layers and exhibits a peak wavelength of 500 nm, and a third multiple quantum well that comprises $In_{0.43}Ga_{0.57}N$ well layers and exhibits a peak wavelength of 490 nm. With this nitride light-emitting device, nearly pure white light can be obtained.

In *Japanese Journal of Applied Physics*, Vol. 41, 2002, pp. L1431-L1433, InGaN light-emitting diodes are described. Referring to FIG. 5 of the publication, the quantum efficiency of InGaN light-emitting diodes varies depending on the injected current density, and in particular, the quantum efficiency of blue-light emitting diodes varies greatly in accordance with the injected current density.

In each of the nitride light-emitting devices in Pat. App. Pub. No. H10-22525 the wavelength of light from one of the multiple quantum wells differs from that of light from the others, meaning that in none of the nitride light-emitting devices does the progression of the spectral-component magnitudes change independently of the density of the current injected into the devices.

As set forth in *Japanese Journal of Applied Physics*, ibid., the quantum efficiency of InGaN light-emitting devices varies in accordance with the injected current density, and in particular, the quantum efficiency of blue-light emitting diodes varies significantly depending on the injected current density.

BRIEF SUMMARY OF THE INVENTION

An object of the present invention, having been brought about in consideration of the foregoing circumstances, is to make available nitride semiconductor light-emitting devices having a structure that enables adjusting the dependency of emission efficiency on the density of injected current.

One aspect of the present invention is a nitride semiconductor light-emitting device furnished with: (a) an n-type gallium nitride semiconductor region; (b) a p-type gallium nitride semiconductor region; and (c) an emission region having a quantum well structure provided between the n-type and the p-type gallium nitride semiconductor regions; wherein the quantum well structure includes a plurality of first well layers composed of $In_xGa_{1-x}N$, one or a plurality of second well layers composed of $In_yGa_{1-y}N$, and barrier layers; the second well layer thickness is greater than the first well layer thickness; the barrier layers are arranged in alternation with the first and second well layers; and the emission wavelength of the first well layers approximately equals that of the second well layer(s) at a given density of current applied to the nitride semiconductor light-emitting device.

According to this nitride semiconductor light-emitting device, the thinner first well layers emit light efficiently at low current densities, while the thicker second well layer(s) emit light efficiently at high current densities. The emission wavelength of the first well layers equals that of the second well layer(s) at a given density of current applied to the nitride semiconductor light-emitting device. For this reason, employing in light-emitting devices that emit light having a desired wavelength the plurality of well layers that differ in emission efficiency makes it possible to control the dependency of emission efficiency on current density.

The present invention in another aspect is a nitride semiconductor light-emitting device furnished with: (d) an n-type gallium nitride semiconductor region; (e) a p-type gallium nitride semiconductor region; and (f) an emission region having a quantum well structure provided between the n-type and the p-type gallium nitride semiconductor regions; wherein the quantum well structure includes a plurality of first well layers composed of $In_xGa_{1-x}N$, one or a plurality of second well layers composed of $In_yGa_{1-y}N$, and barrier layers; the barrier layers are arranged in alternation with the first and second well layers; the second well layer(s) lie between the first well layers and the p-type gallium nitride semiconductor region; the indium component in the second well layer(s) is smaller than that in the first well layers; and the second well layer thickness is greater than the first well layer thickness.

According to this nitride semiconductor light-emitting device, the thin first well layers emit light efficiently at low current densities, while the thick second well layer(s) emit light efficiently at high current densities. Because the second well layer(s), whose cristallinity is liable to deteriorate, lie between the first well layers and the p-type gallium nitride semiconductor region, the crystallinity of the first well layers is not harmed. Furthermore, the emission wavelength of the first well layers and that of the second well layer(s) have different dependencies on the density of current applied to the nitride light-emitting device. Making the thickness of the second well layer(s) greater than the thickness of the first well layers, and making the indium component in the second well layer(s) smaller than indium component in the first well layers, results in the emission wavelength of the first well layers at a first density of current applied to the nitride semiconductor light-emitting device being greater than the emission wavelength of the second well layer(s), and in the emission wavelength of the first well layers at a second density of current applied to the nitride semiconductor light-emitting device being smaller than the emission wavelength of the second well layer(s). For these reasons, utilizing a plurality of well layers that differ from each other in emission efficiency makes it possible to adjust the dependency of emission efficiency on current density.

In nitride semiconductor light-emitting devices involving the present invention, the first well layer thickness is preferably less than 4 nm, and the second well layer thickness is preferably 4 nm or more.

In accordance with this nitride semiconductor light-emitting device, with 4 nanometers as the divide, distinguishing the thin well layer thickness from the thick well layer thickness facilitates providing a difference between thin well layers and thick well layers in terms of dependency of emission efficiency on current density.

In the nitride semiconductor light-emitting devices involving the present invention, the number of second well layers is preferably smaller than the number of first well layers.

In nitride semiconductor light-emitting devices involving the present invention, making the number of second well layers smaller than the number of first well layers, where favorable crystal quality is readily obtained, makes the crystalline quality of the entire quantum well structure favorable.

The emission wavelength of nitride semiconductor light-emitting devices involving the present invention ranges from 400 nm to 550 nm inclusive. Within this wavelength range in particular, the dependency of emission efficiency on density of injected current is significant.

Nitride semiconductor light-emitting devices involving the present invention are further furnished with (g) a III-nitride substrate having a first surface, and a second surface on the opposite side of the substrate from the first surface, with the n-type gallium nitride semiconductor region, emission region, and p-type gallium nitride semiconductor region being arranged on the III-nitride substrate first surface, wherein the threading dislocation density of the n-type gallium nitride semiconductor region is $1\times10^7$ cm$^{-2}$ or less.

In such nitride semiconductor light-emitting devices, inasmuch as the threading dislocation density is $1\times10^7$ cm$^{-2}$ or less, the crystallinity of the thick well layers, which are sensitive to dislocations, is proves to be better still.

The III-nitride substrate in the nitride semiconductor light-emitting devices involving the present invention is preferably a gallium nitride substrate.

Employing a gallium nitride substrate in the nitride semiconductor light-emitting devices makes it possible to provide a low-dislocation-density underlayer to the well layers.

The above-described object of the present invention, and other objects, characteristics and advantages will become more apparent from the following detailed description of a preferred embodiment of the present invention, with reference being made to the attached drawings.

As described above, the present invention affords nitride semiconductor light-emitting devices having a structure that enables adjusting the dependency of emission efficiency on density of injected current.

The ideas behind the present invention can be easily understood by giving consideration to the following detailed description while referring to the accompanying drawings presented as examples. With reference being made to the attached drawings, explanation will now be given of embodiments of the present invention relating to a nitride semiconductor light-emitting device. When possible, identical parts have been labeled with the same reference mark.

BRIEF DESCRIPTION OF THE SEVERAL VIEWS OF THE DRAWINGS

FIGS. 3A through 3C are diagrams illustrating structures of light-emitting diodes of Experimental Example 1;

FIG. 4 is a diagram plotting the relationship between emission peak wavelength and applied current in the light-emitting diodes A and B of Experimental Example 1;

DETAILED DESCRIPTION OF THE INVENTION

Embodiment 1

Figure 1:
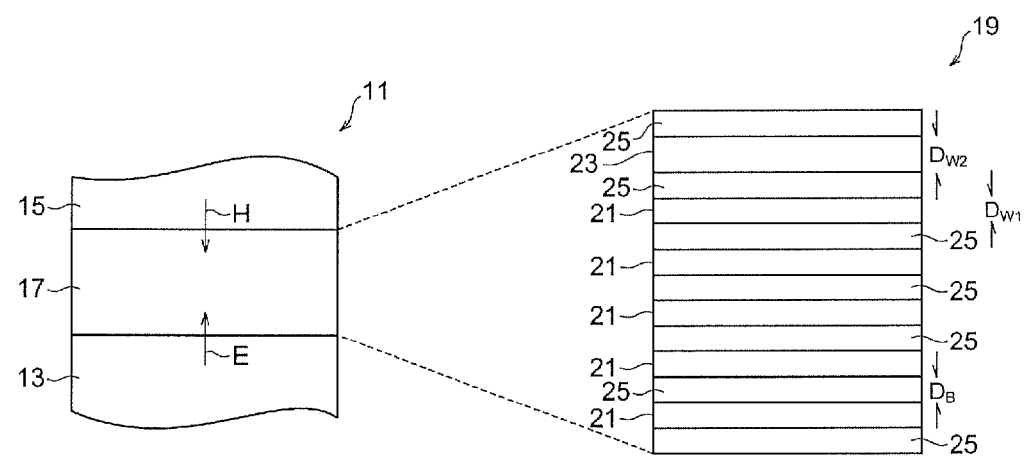
FIG. 1 is a diagram illustrating a major portion of a nitride semiconductor light-emitting device involving an embodiment of the present invention.
Figure 2:
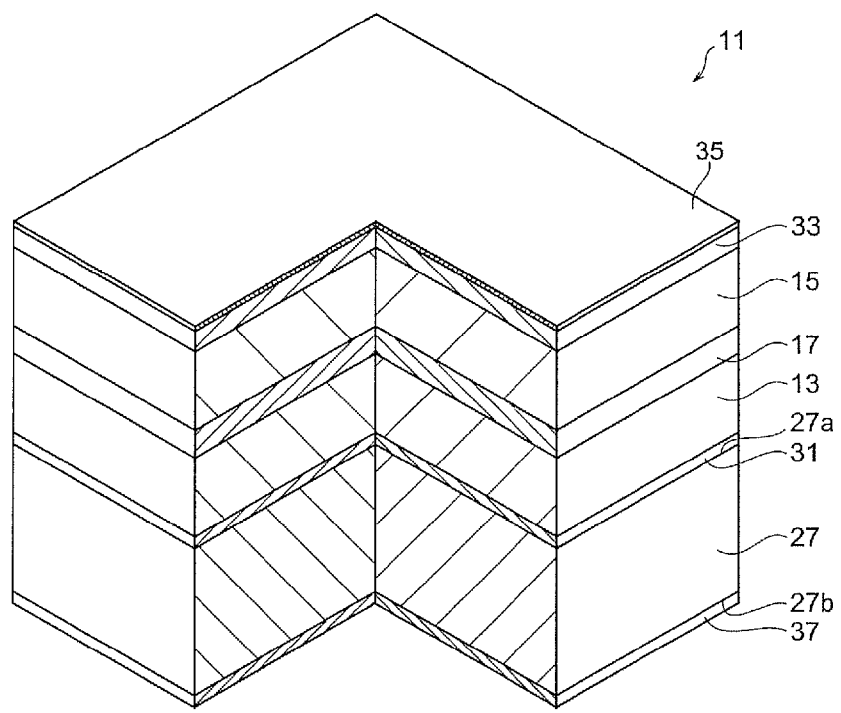
FIG. 2 is a diagram illustrating a structure of the nitride semiconductor light-emitting device.

FIG. 1 is a diagram illustrating a major portion of a nitride semiconductor light-emitting device involving the present invention. FIG. 2 is a diagram illustrating a structure of the nitride semiconductor light-emitting device. A nitride semiconductor light-emitting device 11 includes an n-type nitride gallium semiconductor region 13, a p-type gallium nitride semiconductor region 15, and an emission region 17. A quantum well structure 19 is provided between the n-type nitride gallium semiconductor region 13 and the p-type gallium nitride semiconductor region 15. Electrons E are supplied from the n-type gallium nitride semiconductor region 13 to the emission region 17. Holes H are supplied from the p-type gallium nitride semiconductor region 15 to the emission region 17. The quantum well structure 19 consists of a plurality of first well layers 21 composed of In$_x$Ga$_{1-x}$N, one or a plurality of second well layers 23 composed of In$_y$Ga$_{1-y}$N, and barrier layers 25. The first and second well layers 21, 23 are arranged in alternation with the barrier layers 25. The second well layers 23 lie between the first well layers 21 and the p-type gallium nitride semiconductor region 15. The indium component y in the second well layers 23 is smaller than indium component x in the first well layers 21, and the thickness D$_{W2}$ of the second well layers 23 is greater than the thickness D$_{W1}$ of the first well layers 21.

In the nitride semiconductor light-emitting device 11, the thin first well layers 21 emit light efficiently at low current densities, while the thick second well layers 23 emit light efficiently at high current densities. Because the second well layers 23, the crystallinity of which is prone to deteriorating, lie between the first well layers 21 and the p-type gallium nitride semiconductor region 15, the crystallinity of the first well layers is not harmed. Furthermore, the emission wavelength of the first well layers 21 and that of the second well layers 23 have different dependencies on the density of current applied to the nitride semiconductor light-emitting device 11. Making the thickness D$_{W2}$ of the second well layers 23 greater than the thickness D$_{W1}$ of the first well layers 21, and making the indium component y of the second well layers 23 smaller than the indium component x of the first well layers 21 makes the emission wavelength of the first well layers 21 at a first density of current applied to the nitride semiconductor device 11 greater than the emission wavelength of the second well layers 23, and makes the emission wavelength of the first well layers 21 at a second density of current applied to the nitride semiconductor device 11 greater than emission wavelength of the second well layers 23. For these reasons, utilizing, in light-emitting devices that emit light of a desired wavelength, the well layers 21 and 23 that differ from each other in emission efficiency makes it possible to adjust the dependency of emission efficiency on current density.

Moreover, in the nitride semiconductor light-emitting device 11 involving the present invention, the emission wavelength of the first well layers 21 approximately equals that of the second well layers 23 at a given density (for example, at $I_{DEN1}$ indicated by the arrow in FIG. 4) of current applied to the nitride semiconductor light-emitting device 11. The thin first well layers 21 emit light efficiently at low current densities, while the thick second well layers 23 emit light efficiently at high current densities, in the nitride semiconductor light-emitting device 11. For this reason, employing the well layers 21 and 23 that differ in emission efficiency enables controlling the dependency of emission efficiency on current density. The emission wavelength of the first well layers 21 approximately equals that of the second well layers 23 at a given density of the current applied to the nitride semiconductor light-emitting device 11, and at any current density within a practical current density range (for example, the range of 0 A/cm$^2$ to 200 A/cm$^2$ inclusive).

The quantum well structure 19 in the nitride semiconductor light-emitting device 11 is formed so that the emission wavelength of the nitride semiconductor light-emitting device 11 ranges from 400 nm to 550 nm inclusive. The dependency of emission efficiency on density of injected current is grater particularly within this wavelength range. The spectrum of light from the nitride semiconductor light-emitting device 11 substantially has a single peak wavelength. The composition in the first well layers 21 and their thickness and the composition in the second well layers 23 and their thickness are thus adjusted so that the wavelength of light from the first well layers 21 approximately equal that of light from the second well layers 23. At low current densities, emission efficiency of one of the two types of well layers is greater than the other, while at high current densities, vice versa. The emission efficiency of one of the two types of well layers approximately equal that of the other at a given density of the current applied to the nitride semiconductor light-emitting device 11.

In the nitride semiconductor light-emitting device 11, the threading dislocation density of the n-type gallium nitride semiconductor region 13 is 1×10$^7$ cm$^{-2}$ or less. This dislocation density can minimize degradation of the thick well layer crystallinity.

Referring to FIG. 2, the nitride semiconductor light-emitting device 11 further includes a III-nitride substrate 27. The III-nitride substrate 27 has a first surface 27a, and a second surface 27b on the opposite side of the substrate 27 from the first surface 27a. The n-type gallium nitride semiconductor region 13, emission region 17, and p-type gallium nitride semiconductor regions 15 are arranged successively on the first surface 27a of the III-nitride substrate 27, and the n-type gallium nitride semiconductor region 13 is 1×10$^7$ cm$^{-2}$ or less in threading dislocation density. In this nitride semiconductor light-emitting device 11, the crystallinity of the thick well layers 23 sensitive to dislocations further improves because the n-type gallium nitride semiconductor region 13 is 1×10$^7$ cm$^{-2}$ or less in threading dislocation density.

Preferably, the III-nitride substrate 27 is a gallium nitride substrate. The availability of a gallium nitride substrate with a threading dislocation density of 1×10$^7$ cm$^{-2}$ or less can provide for well layer growth a low-threading-density underlayer that has been grown on the gallium nitride substrate. As the III-nitride substrate 27, AlN can be utilized.

Additionally, the nitride semiconductor light-emitting device 11 further includes a buffer layer 31 provided on the first surface 27a of the III-nitride substrate 27. The buffer layer 31 is preferably composed of AlGaN. Growing an AlGaN layer onto the gallium nitride substrate provides an under-semiconductor-region preferable for growing the n-type gallium nitride semiconductor region 13.

The nitride semiconductor light-emitting device 11 further includes a p-type gallium nitride contact region 33 provided on the p-type gallium nitride contact region 15, and an anode electrode 35 provided on the p-type gallium nitride contact region 33. The anode electrode 35 is preferably composed of a translucent electrode. A cathode electrode 37 is provided on the second surface 27b of the III-nitride substrate 27.

In the nitride semiconductor light-emitting device 11, the thickness $D_{W1}$ of the first well layers 21 is preferably 4 nanometers or less. The reason is that in the situation in which the well layer thickness is 4 nanometers or less, In compositional fluctuations are introduced efficiently without crystallinity degradation, and thus emission efficiency at low current densities improves. The thickness $D_{W2}$ of the second well layers 23 is preferably 4 nanometers or more. The reason is that in a situation in which the well layer thickness is 4 nanometers or more, the decrease in In component necessary to obtain the desired emission wavelength enables manufacturing homogeneous well layers, and thus emission efficiency at high current densities can be heightened. With 4 nanometers as the divide, distinguishing the thickness of the thin well layers 21 from that of the thick well layers 23 facilitates providing a difference in the dependency of emission efficiency on current density between the thin well layers 21 and thick well layers 23. The first well layers 21 are formed between the second well layers 23 and the n-type gallium nitride semiconductor region 13. Because the first well layers 21 can be grown prior to the growth of the second well layers 23, the crystallinity of the thin well layers 21 is not adversely affected by that of the thick well layers. Furthermore, the second well layers 23 are formed between the first well layers 21 and the p-type gallium nitride semiconductor region 15. The fact that the second well layers 23 can be grown after the growth of the first well layers 21 enables growing the thick well layers onto the thin well layers 21 having crystallinity, reducing degradation of the crystallinity of the thick well layers.

The number of the second well layers 23 is preferably smaller than that of the first well layers 21 in the nitride semiconductor light-emitting device 11. In this situation in which the number of the second well layers 23 is smaller than that of the first well layers 21, the crystallinity of the whole quantum well structure 19 improves.

Experimental Example 1

Light-emitting diodes A, B, and C as illustrated in FIGS. 3A through 3C are prepared. A gallium nitride support substrate is employed in the light-emitting diodes A, B, and C. The structure of the light-emitting diode A is:
 a buffer layer 41: $Al_{0.12}Ga_{0.88}N$, 50 nm in thickness;
 an n-type gallium nitride semiconductor region 43: GaN, 2 micrometers in thickness;
 well layers 45a of quantum well structure: $In_{0.14}Ga_{0.86}N$, 3 nm in thickness;
 barrier layers 45b of quantum well structure: $In_{0.01}Ga_{0.99}N$, 15 nm in thickness;
 a p-type gallium nitride semiconductor region 47: 20 nm in thickness; and
 a p- and n-type gallium nitride contact layer 49: 50 nm in thickness.

The structure of the light-emitting diode B is:

a buffer layer 51: $Al_{0.12}Ga_{0.88}N$, 50 nm in thickness;

an n-type gallium nitride semiconductor region 53: GaN, 2 micrometers in thickness;

well layers 55a of quantum well structure: $In_{0.11}Ga_{0.89}N$, 5 nm in thickness;

barrier layers 55b of quantum well structure: $In_{0.01}Ga_{0.99}N$, 15 nm in thickness;

a p-type gallium nitride semiconductor region 57: 20 nm in thickness; and a p- and n-type gallium nitride contact layer 59: 50 nm in thickness.

The structure of the light-emitting diode C:

a buffer layer 61: $Al_{0.12}Ga_{0.88}N$, 50 nm in thickness;

an n-type gallium nitride semiconductor region 63: GaN, 2 micrometers in thickness;

first well layers 65a of quantum well structure: $In_{0.14}Ga_{0.86}N$, 3 nm in thickness;

barrier layers 65b of quantum well structure: $In_{0.01}Ga_{0.99}N$, 15 nm in thickness;

a second well layer 65c of quantum well structure: $In_{0.11}Ga_{0.89}N$, 5 nm in thickness;

a p-type gallium nitride semiconductor region 67: 20 nm in thickness; and a p- and n-type gallium nitride contact layer 69: 50 nm in thickness.

The composition in the first well layers 65a and their thickness the first well layers 65a and the composition of the second well layers 65c and their thickness are adjusted so that the wavelength of light from the first well layers 65a approximately coincides with that of light from the second well layers 65c.

The process of producing the light-emitting diodes A, B, and C is as follows. The gallium nitride substrate is heat-treated in an ammonia ($NH_3$)-hydrogen ($H_2$) atmosphere. Subsequently, an n-type $Al_{0.12}Ga_{0.88}N$ film (doped with silicon) and an n-type GaN film (doped with silicon) are successively grown onto the gallium nitride substrate. Next, an emission region of 6-period quantum well structure is formed.

After that, a p-type $Al_{0.18}Ga_{0.82}N$ film (doped with Mg) and a p-type GaN film (doped with Mg) are successively grown onto the emission region. A Ti/Al electrode is created on the back side of the gallium nitride substrate, and a Ni/Au electrode on the p-type GaN film. Furthermore, a pad electrode is created on the Ni/Au electrode. In the light-emitting diodes A, B, and C, n-type GaN layers and other n-type gallium nitride semiconductor regions are $1 \times 10^7$ cm$^{-2}$ or less, and specifically are $1 \times 10^6$ cm$^{-2}$ or less, in threading dislocation density.

The emission characteristics of the light-emitting diodes A, B, and C produced in such a manner were evaluated. FIG. 4 is a diagram showing a relationship between the emission wavelength and the applied currents in the light-emitting diodes A and B.

Because the well layer composition and thickness in light-emitting diodes A and B have been adjusted, the emission wavelength of the light-emitting diode A approximately equals that of the light-emitting diode B over a wide range of applied current. In the light-emitting diodes A, B, and C, applied current of 200 mA corresponds to current density of 125 A/cm$^{-2}$. As shown in FIG. 4, the characteristic line of the peak wavelength of light from the light-emitting diode A intersects with that of the peak wavelength of light from the light-emitting diode B within a range of applied currents of up to 200 mA. Both the peak wavelengths of the light-emitting diodes A and B shortens with the increasing applied current.

The amount of shifting from the lowest applied current to the intersection of the characteristic lines (of the light-emitting diode B) is larger than that (of the light emitting diode A) from the lowest applied current to the intersection of the characteristic lines. Such a behavior results from the fact that the influence of piezoelectric-effect in the well layers of the light-emitting diode B is great because the well layers are thick.

Figure 5:
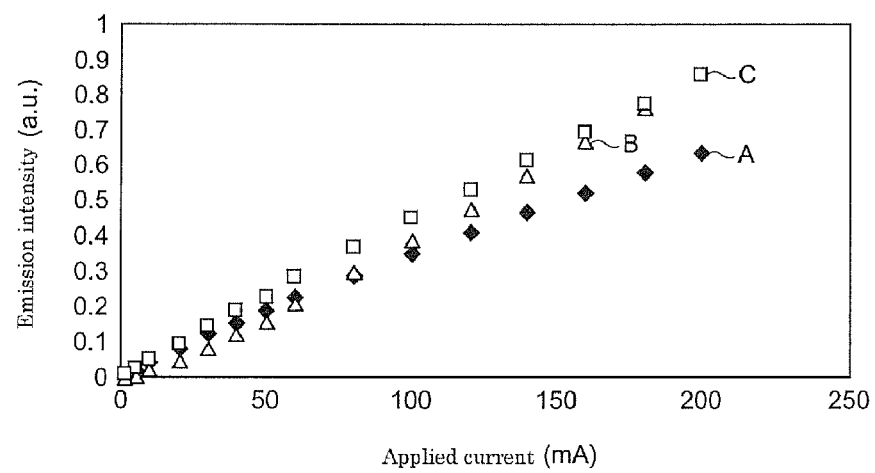
FIG. 5 is a diagram plotting the relationship between emission intensity and applied current in the light emitting diodes A, B, and C of Experimental Example 1.

As shown in FIG. 5, among the three types of light-emitting diodes, the light-emitting diode A has the strongest emission intensity within a range of low current densities. The emission efficiency of the light-emitting diode A, however, decreases with the increasing applied current, as demonstrated in FIG. 6. The reason is that due to the indium compositional variance in the well layers, (several) parts, with hither emission efficiency, of the well layers, emit light mainly—that is, the emission region is localized. Nevertheless, a type of the light-emitting diode in which an increase in the density of applied current widens the emitting parts, resulting in a decrease in emission efficiency has been proposed.

Figure 6:
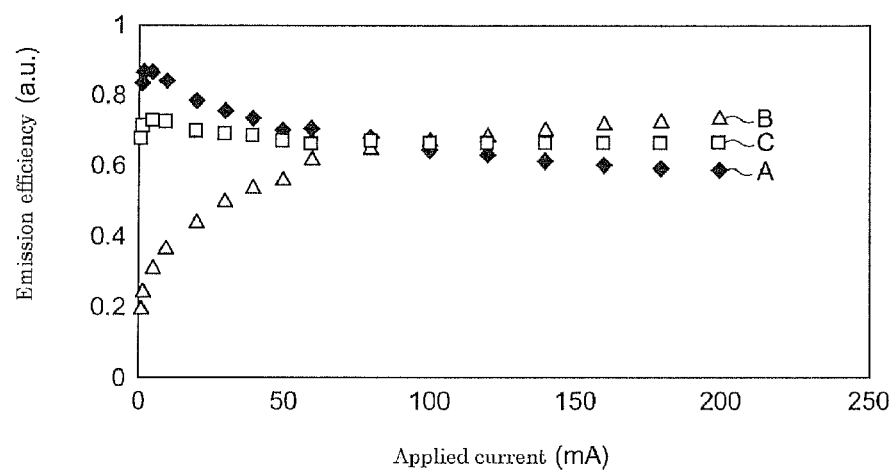
FIG. 6 is a diagram plotting the relationship between emission efficiency and applied current in the light-emitting diodes A, B, and C of Experimental Example 1.

The light-emitting diode B has lower emission intensities at low current densities, while it exhibits with the increasing current density higher emission intensities exceeding those that the light-emitting diode A exhibits, as shown in FIG. 5. Such a behavior means that superior injection characteristics are being improved in thick well layers with small indium component, as shown in FIG. 6. There are the following two reasons why emission intensity is low at low current densities. The first reason: thickening the well layers harms crystallinity of InGaN for them. Repeating well layer growth results in an increase in defect introduced to the quantum well structure. The increase in the defect decreases the emission efficiency at low current densities sensitive to the influence of nonradiative recombination.

The second reason: the influence of piezoelectric field is more strongly exerted with increasing well layer thickness, and thus a wide spatial separation between the electron and the hall is generated to decrease emission efficiency. In the piezoelectric field, an increase in current injected to the emission region causes screening by injected carriers, leading to a rise in emission efficiency at high current injections.

The light-emitting diode C, as shown in FIG. 6, keeps high emission efficiency over a wide range of applied current. Because thick well layers 5 nm in thickness lie near the p-region, these thick well layers most greatly contribute to emission. Furthermore, the thin well layers that exhibit superior emission efficiency at low current densities can contribute to emission, inasmuch as carriers are injected also to the thin well layers. The 3-nm thick thin well layers 3 provided to the base for the thick well layers prevents degradation of the crystallinity of the thin well layers even if the thick well layers 5 nm in thickness is provided, and also prevents crystallinity of the thick layers from being spoiled.

High emission efficiency is maintained over a wide range of current densities (for example, a range from 0 A/cm$^2$ to 200 A/cm$^2$ inclusive). The full width and half maximum of the emission spectrum in the light-emitting diode C is larger than those of the emission spectrum in each of the light-emitting diodes A and B.

Experimental Example 2

Figure 7A:
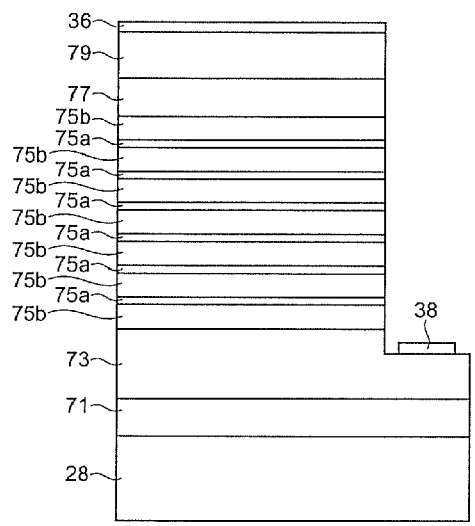
FIG. 7 is diagram illustrating the structures of light-emitting diodes D and E of Experimental Example 2.
Figure 7B:
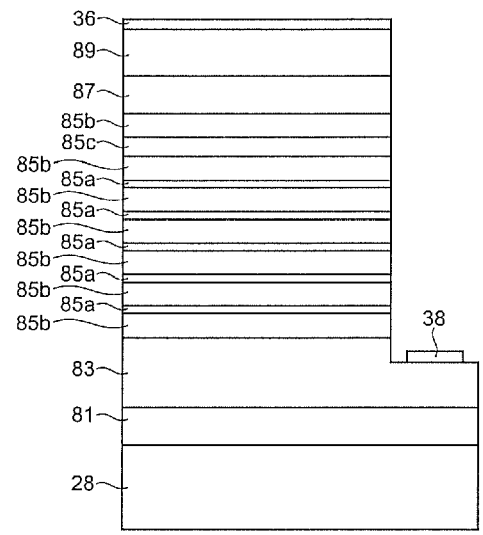

Light-emitting diodes D and E as illustrated in FIGS. 7A and 7B are prepared. In the light-emitting diodes D and E, a sapphire support substrate 28 is employed. The process of producing the light-emitting diodes D and E is as follows. The sapphire substrate 28 is heat-treated in a hydrogen ($H_2$) atmosphere. Subsequently, an n-type GaN buffer layer and an n-type GaN film (doped with silicon) are successively grown onto the sapphire substrate 28. After that, as in the process of producing the light-emitting diodes A, B, and C, an emission region of 6-period quantum well structure is formed. Next, a p-type $Al_{0.18}Ga_{0.82}N$ film (doped with Mg) and a p-type GaN film (doped with Mg) are successively grown onto the emission region. A Ti/Al electrode 38 is created on the n-type GaN film that has been exposed as a result of etching, and a Ni/Au electrode is created on the p-type GaN film. Furthermore, a Ti/Au pad electrode is created on a Ni/Au electrode 36.

The structure of the light-emitting diode D consists of:
a buffer layer 71: GaN, 25 nm in thickness;
an n-type gallium nitride semiconductor region 73: GaN doped with Si, 5 micrometers in thickness;
well layers 75a of quantum well structure: $In_{0.14}Ga_{0.86}N$, 3 nm in thickness;
barrier layers 75b of quantum well structure: $In_{0.01}Ga_{0.99}N$, 15 nm in thickness;
a p-type gallium nitride semiconductor region 77: 20 nm in thickness; and
a p- and n-type gallium nitride contact layer 79: 50 nm in thickness.

The structure of the light-emitting diode E consists of:
a buffer layer 81: GaN, 25 nm in thickness;
an n-type gallium nitride semiconductor region 83: GaN doped with Si, 5 micrometers in thickness;
first well layers 85a of quantum well structure: $In_{0.14}Ga_{0.86}N$, 3 nm in thickness;
barrier layers 85b of quantum well structure: $In_{0.01}Ga_{0.99}N$, 15 nm in thickness;
a second well layer 85c of quantum well structure: $In_{0.11}Ga_{0.89}N$, 5 nm in thickness;
a p-type gallium nitride semiconductor region 87: 20 nm in thickness; and
a p- and n-type gallium nitride contact layer 89: 50 nm in thickness.

The composition in the first well layers 85a and their thickness and the composition in the second well layer 85c and its thickness are adjusted so that the wavelength of light from the first well layers 85a approximately coincides with that of light from the second well layer 85c.

The emission intensity of the light-emitting diode D approximately equals that of the light-emitting diode A. The reason is that the influence of threading dislocation density further is made less than that of the spatial fluctuations of the indium component in the thin well layers. The emission intensity of the light-emitting diode E is nearly half of that of the light-emitting diode C. This result demonstrates that the crystallinity of the thick InGaN well layer is sensitive also to threading dislocations.

In the light-emitting diodes D and E, the n-type GaN layers and other n-type gallium nitride semiconductor regions are a level of $1\times10^8$ cm$^{-2}$ in threading dislocation density. Experiments by the inventors reveals that in a situation in which the n-type gallium nitride semiconductor region is $1\times10^7$ cm$^{-2}$ or less in threading dislocation density, superior emission characteristics can be obtained. For this reason, the gallium nitride substrate is advantageously employed.

The reason why blue LED efficiency is high is understood as follows. In the InGaN well layers, potential fluctuations occur because the indium component becomes inhomogeneous in its own right. When the injected carriers are localized in a region with low potential, they recombine before trapped to defects in the InGaN well layers, and contribute to emission. Increasing the applied current causes the carries to overflow outside the region with low potential, and thus some of the carriers are trapped by the defects in the GaN well layers. As a result, the efficiency decreases.

As set forth in *Japanese Journal of Applied Physics*, Vol. 41, 2002, pp. L1431-L1433, emission efficiency of blue LEDs decreases with increasing applied current. Although the decrease in emission efficiency counts for nothing in applications, such as backlight and decorative light sources with low rated currents, the decrease in emission efficiency becomes marked in applications, such as vehicle headlights and illumination lamps, because they must be driven at high currents.

The technological essence of the present invention has been explained with reference to the drawings as preferred embodiments. A person skilled in the art will recognize that various modifications of disposition and details are possible without departing from such technological essence. Although semiconductor light emitting diodes, such as light-emitting diodes, are described, the present invention is not limited to the specific configuration explained in the embodiments. Therefore, the applicant reserves the rights to all amendments and modifications deriving from the claims and the spirit of the claims.

What is claimed is:

1. A nitride semiconductor light-emitting device, comprising:
an n-type gallium nitride semiconductor region;
a p-type gallium nitride semiconductor region; and
an emission region having a quantum well structure provided between the n-type and the p-type gallium nitride semiconductor regions; wherein
the quantum well structure includes a plurality of first well layers composed of $In_xGa_{1-x}N$, one or a plurality of second well layers composed of $In_yGa_{1-y}N$, and barrier layers composed of $In_zGa_{1-z}N$ ($0 \leqq z \leqq 1$, z<x, z<y);
the second well layer thickness is greater than the first well layer thickness;
the barrier layers are arranged in alternation with the first and second well layers; and
the emission wavelength of the first well layers approximately equals the emission wavelength of the second well layers at a given density of current applied to the nitride semiconductor light-emitting device.

2. A nitride semiconductor light-emitting device as set forth in claim 1, wherein:
the first well layer thickness is less than 4 nm; and
the second well layer thickness is 4 nm or more.

3. A nitride semiconductor light-emitting device as set forth in claim 1, wherein the number of second well layers is less than the number of first well layers.

4. A nitride semiconductor light-emitting device as set forth in claim 1, wherein the emission wavelength of the nitride semiconductor light-emitting device ranges from 400 nm to 550 nm inclusive.

5. A nitride semiconductor light-emitting device as set forth in claim 1, further comprising a III-nitride substrate having a first surface, and a second surface on the opposite side of the substrate from the first surface; wherein
the n-type gallium nitride semiconductor region, emission region, and p-type gallium nitride semiconductor region are arranged successively on the first surface of the III-nitride substrate; and
the threading dislocation density of the n-type gallium nitride semiconductor region is $1\times10^7$ cm$^{-2}$ or less.

6. A nitride semiconductor light-emitting device as set forth in claim 5, wherein the III-nitride substrate is a gallium nitride substrate.

* * * * *

UNITED STATES PATENT AND TRADEMARK OFFICE
CERTIFICATE OF CORRECTION

PATENT NO. : 7,884,351 B2
APPLICATION NO. : 11/874908
DATED : February 8, 2011
INVENTOR(S) : Takashi Kyono et al.

It is certified that error appears in the above-identified patent and that said Letters Patent is hereby corrected as shown below:

In claim 1, 11$^{th}$ line (column 10, line 32),
"$0 \leqq z \leqq 1$" should read --$0 \leqq z < 1$--.

Signed and Sealed this
Third Day of May, 2011

David J. Kappos
*Director of the United States Patent and Trademark Office*